(12) United States Patent
Gerlach et al.

(10) Patent No.: US 10,116,119 B2
(45) Date of Patent: Oct. 30, 2018

(54) COMPACT LASER DEVICE

(71) Applicant: KONINKLIJKE PHILIPS N.V., Eindhoven (NL)

(72) Inventors: Philipp Henning Gerlach, Ulm (DE); Alexander Weigl, Ulm (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/028,546

(22) PCT Filed: Oct. 14, 2014

(86) PCT No.: PCT/EP2014/071938
§ 371 (c)(1),
(2) Date: Apr. 11, 2016

(87) PCT Pub. No.: WO2015/055600
PCT Pub. Date: Apr. 23, 2015

(65) Prior Publication Data
US 2016/0254640 A1 Sep. 1, 2016

(30) Foreign Application Priority Data
Oct. 16, 2013 (EP) ..................................... 13188872

(51) Int. Cl.
H01S 5/02 (2006.01)
H01S 5/028 (2006.01)
(Continued)

(52) U.S. Cl.
CPC ............ *H01S 5/028* (2013.01); *H01L 23/544* (2013.01); *H01L 31/16* (2013.01); *H01S 5/042* (2013.01);
(Continued)

(58) Field of Classification Search
None
See application file for complete search history.

(56) References Cited

U.S. PATENT DOCUMENTS 6,465,744 B2 * 10/2002 Baker ................ H01L 23/3107
174/255
7,127,365 B2 10/2006 Rumsey
(Continued)

FOREIGN PATENT DOCUMENTS

DE 19954093 A1 5/2001
JP 5587452 A 7/1980
(Continued)

OTHER PUBLICATIONS

Rinaldi, Fernando "MBE Growth and Characterization of Multilayer Structures for Vertically Emitting Laser Devices", 2008.

*Primary Examiner* — Armando Rodriguez

(57) ABSTRACT

The invention describes a laser device comprising between two and six mesas (120) provided on one semiconductor chip (110), wherein the mesas (120) are electrically connected in parallel such that the mesas (120) are adapted to emit laser light if a defined threshold voltage is provided to the mesas (120). Two to six mesas (120) with reduced active diameter in comparison to a laser device with one mesa improve the yield and performance despite of the fact that two to six mesas need more area on the semiconductor chip thus increasing the total size of the semiconductor chip (110). The invention further describes a method of marking semiconductor chips (110). A functional layer of the semiconductor chip (110) is provided and structured in a way that a single semiconductor chip (110) can be uniquely identified by means of optical detection of the structured functional layer. The structured layer enables identification of small semiconductor chips (110) with a size below 200 μm×200 μm.

16 Claims, 5 Drawing Sheets

(51) Int. Cl.
  *H01L 23/544* (2006.01)
  *H01S 5/42* (2006.01)
  *H01S 5/042* (2006.01)
  *H01S 5/183* (2006.01)
  *H01L 31/16* (2006.01)
  *H01S 5/22* (2006.01)
  *H01L 21/66* (2006.01)

(52) U.S. Cl.
  CPC ............ *H01S 5/18327* (2013.01); *H01S 5/22* (2013.01); *H01S 5/423* (2013.01); *H01L 22/30* (2013.01); *H01L 2223/5448* (2013.01); *H01L 2223/54413* (2013.01); *H01L 2223/54433* (2013.01); *H01L 2924/0002* (2013.01)

(56) References Cited

U.S. PATENT DOCUMENTS

| | | | |
|---|---|---|---|
| 7,164,702 B1 | 1/2007 | Liu | |
| 7,233,025 B2* | 6/2007 | Davuluri | H01S 5/02252 257/81 |
| 7,244,923 B2* | 7/2007 | Song | H01S 5/0262 250/214.1 |
| 7,305,018 B2 | 12/2007 | Otoma | |
| 7,949,024 B2 | 5/2011 | Joseph | |
| 8,497,141 B2 | 7/2013 | Masui | |
| 2001/0028665 A1* | 10/2001 | Stronczer | H01S 5/0427 372/38.02 |
| 2003/0123508 A1* | 7/2003 | Werner | H01S 5/02284 372/50.21 |
| 2006/0227836 A1* | 10/2006 | Omori | H01S 5/423 372/50.124 |
| 2009/0289266 A1* | 11/2009 | Lee | H01L 27/15 257/84 |
| 2011/0217077 A1* | 9/2011 | Harasaka | B82Y 20/00 399/151 |
| 2012/0014400 A1 | 1/2012 | Gerlach | |
| 2012/0051685 A1 | 3/2012 | Su | |
| 2012/0128020 A1* | 5/2012 | Gerlach | H01S 5/0264 372/50.11 |
| 2013/0022063 A1 | 1/2013 | Kumei | |
| 2013/0266326 A1 | 10/2013 | Joseph | |

FOREIGN PATENT DOCUMENTS

| | | |
|---|---|---|
| JP | S5587452 * | 7/1980 |
| WO | 2011018734 A1 | 2/2011 |
| WO | 2013136205 A2 | 9/2013 |

* cited by examiner

COMPACT LASER DEVICE

CROSS-REFERENCE TO PRIOR APPLICATIONS

This application is the U.S. National Phase application under 35 U.S.C. § 371 of International Application No. PCT/EP2014/071938, filed on Oct. 14, 2014, which claims the benefit of European Patent Application No. 13188872.9, filed on Oct. 16, 2013. These applications are hereby incorporated by reference herein.

FIELD OF THE INVENTION

The invention relates to a laser device wherein the laser device is especially suited for sensing applications. The invention further relates to a method of marking semiconductor chips in a unique way.

BACKGROUND OF THE INVENTION

Laser devices for optical sensors often comprise Vertically Cavity Surface Emitting Lasers (VCSEL). Next generation require an optical output power of at least 6 mW. State of the art VCSELs with such high output power are realized by increasing the diameter of the aperture or active diameter of the VCSELs (~14 um). At the same time the total die size needs to be as small as possible and yield of the laser device has to be high in order to meet the cost targets.

SUMMARY OF THE INVENTION

It's thus an object of the present invention to provide an improved laser device enabling a combination of a small die or chip size and high yield.

According to a first aspect a laser device comprising between two and six mesas provided on one semiconductor chip is proposed. The mesas are electrically connected in parallel such that the mesas are adapted to emit laser light if a defined threshold voltage is provided to the mesas. The laser device further comprises a driver for electrically driving the mesas, wherein the driver is adapted to provide the defined threshold voltage to the mesas.

A laser device comprising only one mesa with increased diameter of the aperture may have the advantage that the size of device is small. Size is an essential factor because the chip area determines the number of semiconductor chips per wafer which can be manufactured in one run and therefore the prize of the laser device. Tests have shown that the production yield meaning the number of laser chips per wafer meeting the quality targets of such laser devices with one mesa is unsatisfactory. The production spread is high because of the tight process window. Further investigations have shown that providing between two and six mesas with smaller aperture and thus smaller optical power output per mesa on one semiconductor chip increases the yield and enables a lower temperature sensibility of the laser devices. The mesas are electrically connected in parallel such that in operation all mesas are provided with electrical power at the same time. All mesas on one semiconductor chip thus emit laser light at the same time. The lower temperature sensibility may be caused or at least positively influenced by the heat distribution when operating the two to six mesas in parallel in comparison to the concentrated heat dissipation in case of only one mesa per laser device. The latter effect may be even improved by distributing the between two and six mesas in a way that an even heat distribution is enabled across the laser device. The distance between the mesas may be maximized in relation to the available area on the semiconductor ship. Process steps like dicing and the like may require a minimum distance between a mesa and the edges of the semiconductor chip thus limiting the available area. The form of the chip may thus influence positioning of the mesas. In most cases quadratic semiconductor chips may be preferred. Despite of the fact that semiconductor chips with one mesa are smaller and enable more semiconductor chips the improved yield overcompensates the bigger size of the laser devices caused by the increased number of mesas.

Surprisingly, it doesn't help to provide more than six mesas because the yield decreases again. The investigations have further shown that three mesas per laser device result in the highest yield. The three mesas may be preferably arranged on the available area of the semiconductor chip such that the centers of the mesas build an equilateral triangle in order to maximize the distance between the mesas. This arrangement of the mesas may enable an even distribution of the heat generated in each mesa across the semiconductor chip.

The semiconductor chip of the laser device does preferably have a side length of less than 250 μm. The size of the semiconductor chip determines the number of chips per wafer and thus strongly influences the prize of the laser device. It's the intention to provide semiconductor chips which are as small as possible. At the same time the requested optical power which has to be emitted by the laser devices increases, which would be easier if the chip size would be larger. The side length of the semiconductor chips may be even smaller than 250 μm like 200 μm or even smaller than 150 μm further decreasing the processing window. The laser devices are adapted to emit laser light of an optical power between 4 mW and 10 mW if they are connected to a corresponding driver and power source. The power source may be a conventional AC-line, a battery or any other power source being able to power the laser device and the corresponding driver. The kind of power source may depend on the application. Batteries which are preferably rechargeable may be used in mobile applications like, for example, proximity detection in mobile devices like mobile phones, smartphones, laptops and the like.

The laser device is preferably adapted to be driven at a voltage between 1.6 V and 2.2 V at an electrical current of 12 mA when emitting laser light of an optical power between 4 mW and 10 mW. The laser device may be adapted to emit laser light of an optical power between 4 mW and 10 mW at a temperature of 60° C. of the semiconductor chip. The temperature of the devices may often reach 60° C. in operation. It's thus essential that the optical power doesn't drop below 4 mW in order to fulfill quality requirements. The temperature of the semiconductor chip is the temperature of the substrate of the semiconductor chip and not the local temperature in the active layer of the laser which may be considerably higher.

The laser device is preferably adapted to emit laser light of an optical power at a temperature of 25° C. of the semiconductor chip deviating less than 20% from the laser power emitted at 60° C. of the semiconductor chip when driven at an electrical current of 12 mA. The deviation is most preferably even less than 10%. Some applications require a high temperature stability of the optical output power at a predetermined electrical driving current. High temperature stability of the laser device may reduce the requirements regarding the driving circuit. No additional sensors and/or feedback loops may be required in order to provide the requested optical power across a broad temperature range.

The laser device is preferably adapted to emit laser light with an optical power, wherein the optical power linearly depends on the provided electrical current when driven at an electrical current between 3 mA and 12 mA. The linear dependence of the optical power from the electrical driving current may simplify the control of the optical output power in applications requesting such power control.

The mesas may comprise an active diameter between 5 µm and 9 µm in order to provide an optical power between 4 mW and 10 mW. In case of 2-4 mesas an active diameter between 7 µm and 9 µm may be preferred, whereby most efficient device may comprise mesas with an active diameter of 8 µm. In case of 5-6 mesas an active diameter between 5 µm and 7 µm may be preferred. The active diameter of a mesa is determined by means of an oxidation of a confinement layer within the mesas during processing of the wafer comprising the semiconductor chips. The active diameter restricts the electrical current to a defined area of an active layer within each mesa provided between a bottom and a top Distributed Bragg Reflector (DBR) with respect to the substrate of the semiconductor chip.

The semiconductor chip may preferably comprise a functional layer with a coding for identifying the laser device. In view of the small chip size of preferably 150 µm×150 µm or less chip numbers provided by means of well-known printing technology like ink-jet printing may not be possible. A functional layer may thus be provided comprising a coding enabling an identification of each chip. The coding may be a bar-code provided in the functional layer such that the chip can be optically identified. The functional layer has thus to be visible after processing the semiconductor chip or the laser device. The functional layer may preferably be one of the layers needed for operating the laser device. One of the metallization layers may, for example, be etched such that besides the structure needed to manufacture and finally drive the laser device (e.g. electrical contacts) a bar-code like structure may be visible at one or more edges of the metallization layer. Such a binary code may be used to enable tracing of each laser device. The metallization layer used for tracing the laser device may, for example, additionally be used for bonding and contacting.

Optical sensors for, for example, proximity detection may comprise one or more of the described laser devices. Using arrays comprising a multitude of mesas which can be individually addressed is known for power applications like printing and heating. These applications require high power laser devices providing an optical or laser power of several Watt or even several hundreds of Watt. The array of individually addressable mesas enables a simple switching of the emitted laser power. Optical sensors emit laser light with an optical power of only some mW such that more than one mesa per semiconductor chip seems to be undesirable. Anyhow, the improved yield and temperature stability of laser devices comprising between 2 and six mesas enable improved optical sensors like proximity sensors at reduced costs.

Furthermore, an improved method of marking semiconductor chips especially small semiconductor chips for laser devices is described.

The method comprises the steps of:
providing a functional layer of the semiconductor chip; and
structuring the functional layer in a way that a single semiconductor chip can be uniquely identified by means of optical detection.

The method may enable an unambiguous marking of semiconductor chips or laser devices such that tracing of single, for example, laser devices is enabled. The tracing may be needed for quality management. Structuring of a functional layer like a metallization layer needed for, for example, electrically contacting avoids an additional manufacturing step like printing a serial number on top of the semiconductor chip. Marking of semiconductor chips may thus be simplified.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a semiconductor ship comprising three mesas.

FIG. 2 shows a cross section of a VCSEL showing the optical resonator embedded in a mesa.

FIG. 3 shows a wafer used to manufacture semiconductor chips.

FIG. 4 shows simulated performance data at 25° C. depending on the number of mesas provided on the semiconductor chip.

FIG. 5 shows simulated performance data at 60° C. depending on the number of mesas provided on the semiconductor chip.

FIG. 6 shows measured performance data at 25° C. of a semiconductor chip with one mesa.

FIG. 7 shows measured performance data at 25° C. of a semiconductor chip with three mesas.

FIG. 8 shows measured performance data at 60° C. of a semiconductor chip with one mesa.

FIG. 9 shows measured performance data at 60° C. of a semiconductor chip with three mesas.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
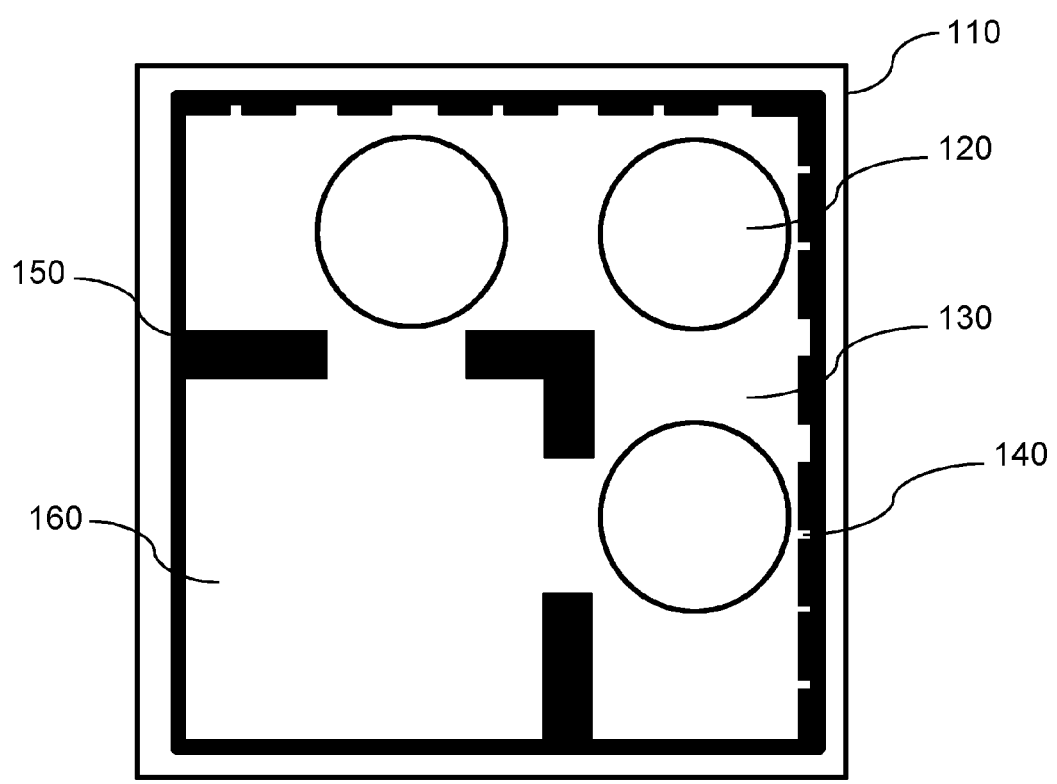
Figure 2:
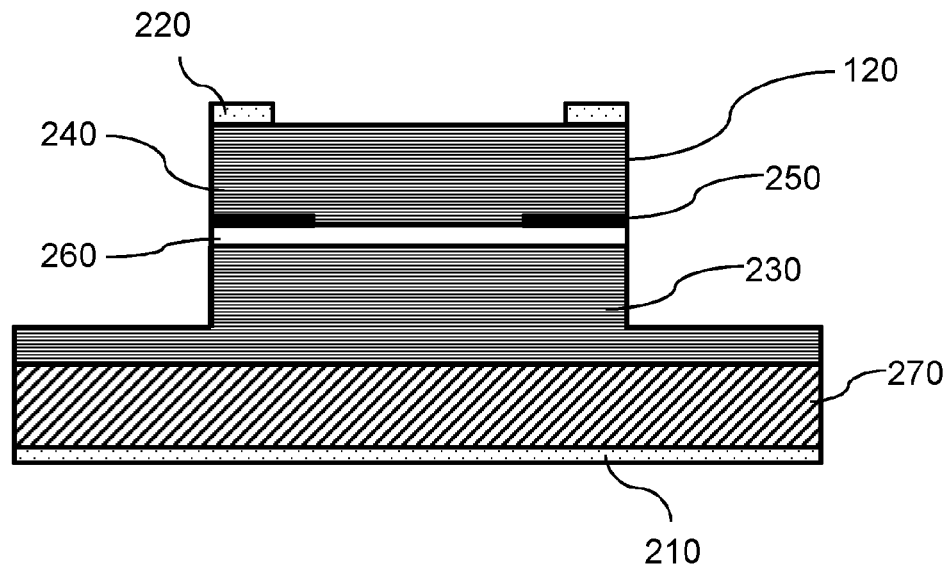

FIG. 1 shows a semiconductor ship 110 comprising three mesas 120. Each of the mesas comprises an optical resonator. A principal sketch of such an optical resonator is shown in FIG. 2. A metallization layer 130 is structured such that a bonding area 160 for electrically contacting the semiconductor chip 110 of the layer device is provided. Furthermore, alignment marks are provided in the metallization layer 130 for aligning the semiconductor chips 110 in the bonding process. The metallization layer 130 further comprises at the upper edge and the right edge a binary code 140 which comprises a number of extensions of different width. The extensions provide a binary code like a bar-code uniquely identifying each semiconductor chip 110. The binary code can be read out by means of optical inspection of the semiconductor chips 110.

FIG. 2 shows a cross section of a VCSEL showing the optical resonator which is embedded in one of the mesas 120. The optical resonator comprises a bottom DBR 230 and a top DBR 240 and an active layer 260 sandwiched in between the bottom DBR 230 and the top DBR 240. The bottom DBR 230 is highly reflective (>99%) and the top DBR 240 does have a somewhat smaller reflectivity (>95%) in order to enable laser emission via the top DBR 240. The VCSEL is thus a so called top emitter. The active layer 260 comprises a number of layers building the Quantum Well structure. The bottom DBR 230 is arranged on a substrate like a GaAs-Substrate. The VCSEL is contacted by means of a bottom electrode 210 and a ring electrode 220. The bottom electrode 210 is provided on the side of the substrate opposite to the bottom DBR 230. The ring electrode 220 is provided on top of the top DBR 240. A confinement layer 250 is used to restrict the current flow through active area to a defined in this case circular area of the active layer. The confinement layer 250 comprises an electrically essentially nonconductive oxide area with a circular hole processed by lateral oxidization of the confinement layer 250 after etching the mesa. The confinement layer 250 is in this case arranged on top of the active layer 260. The confinement layer may also be positioned within the bottom DBR 230 or the top DBR 240. Variations of the arrangement of the layers without affecting the functionality of the layers are well known to those skilled in the art.

Figure 3:
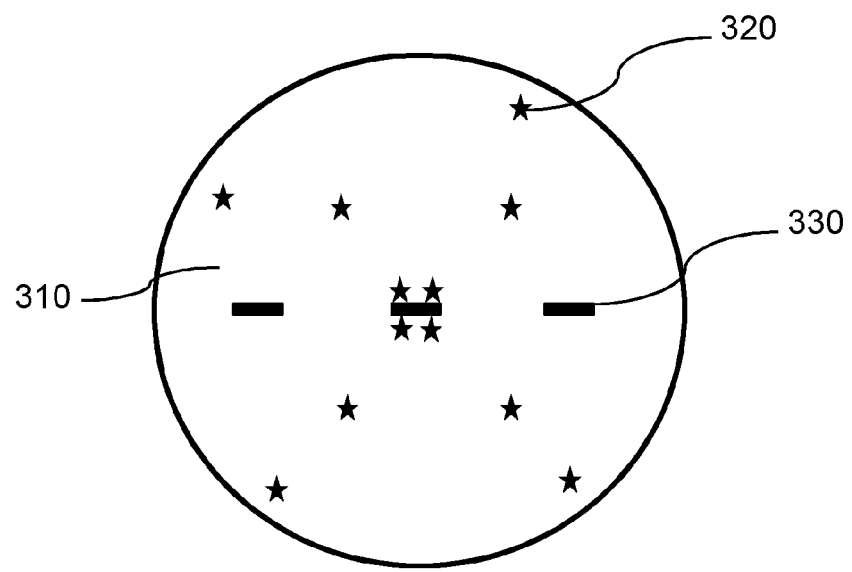

FIG. 3 shows a principal sketch of a wafer 310 used to manufacture the semiconductor chips 110 of the laser device. The semiconductor chips 110 are delivered in sawn condition on UV tape. As the die size is of the semiconductor chips 110 is very small and inking cannot be used to show to the customer which semiconductor chip is good and which one is bad, electronic-mapping is used instead of marking e.g. the bad dies or semiconductor chips 110 by means of inking Reference dies 320 are positioned across the wafer such that good and bad semiconductor chips 110 can be detected by means of the electronic map aligned to the reference dies 320. The wafer further comprises test structures 330 which are provided in order to monitor the oxidation of the devices. The test structures 330 are, for example, VCSEL-like devices on some positions on the wafer that should just be completely oxidized or just be not completely oxidized. For example, full contact mesas with outer diameter ranging from 18 µm to 22 µm in steps of 0.1 um may be used as test structures 330. A mesa with a diameter of 20 µm should just be completely oxidized at a target oxidation width of 10 µm such that no electrical current is flows though the active layer. In case of some deviation from target oxidation width (for example 9.5 µm actual oxidation width), there is still some current flow in the mesa with 20 µm diameter, but no current in the 19 µm diameter mesa. The confinement layer of the mesa shown in FIG. 2 would be completely oxidized in this case. The test structures 330 are integrated in the process such the test mesas are processed with normal bondpads and measured at the same time when 100% of the VCSELs or semiconductor chips are tested on the wafer prober. As each devices on the waferprober is measured much faster than a second, it is only very little additional time needed to measure the test structures 330 at this time in the process in order to control the lateral oxidation of the confinement layer of the mesas.

Figure 4:
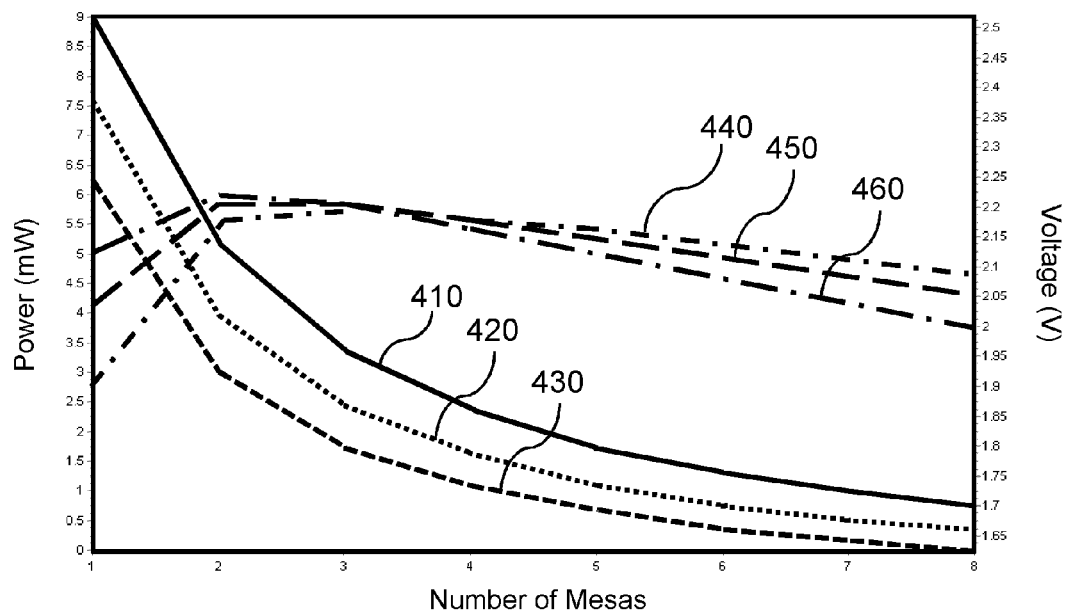

FIG. 4 shows simulated performance data at 25° C. depending on the number of mesas provided on the semiconductor chip 110. The applied electrical current is 12 mA. Line 410 shows the simulated voltage of laser devices depending on the number of mesas provided on the semiconductor chip 110. The production spread of the mesas is nominal−1 Sigma meaning the active diameter of the mesas is smaller than the nominal active diameter. Line 420 shows the simulated voltage at the nominal value of the active diameter and line 430 the simulated voltage at the production spread of nominal+1 Sigma. Lines 440, 450 and 460 show the respective simulated optical power emitted by the laser devices at a production spread of nominal−1 Sigma, nominal and nominal+1 Sigma depending on the number of mesas provided on the semiconductor chip 110 at 25° C. The spread of the emitted optical power is acceptable when between 2 and 6 mesas are provided on the semiconductor chip 110. One mesa causes a broad spread and the applied voltage is too high. The power spread is minimal if three mesas are provided and gets again unacceptable if more than six mesas are provided. Furthermore, the voltage decreases such that the voltage requirements are not fulfilled.

Figure 5:
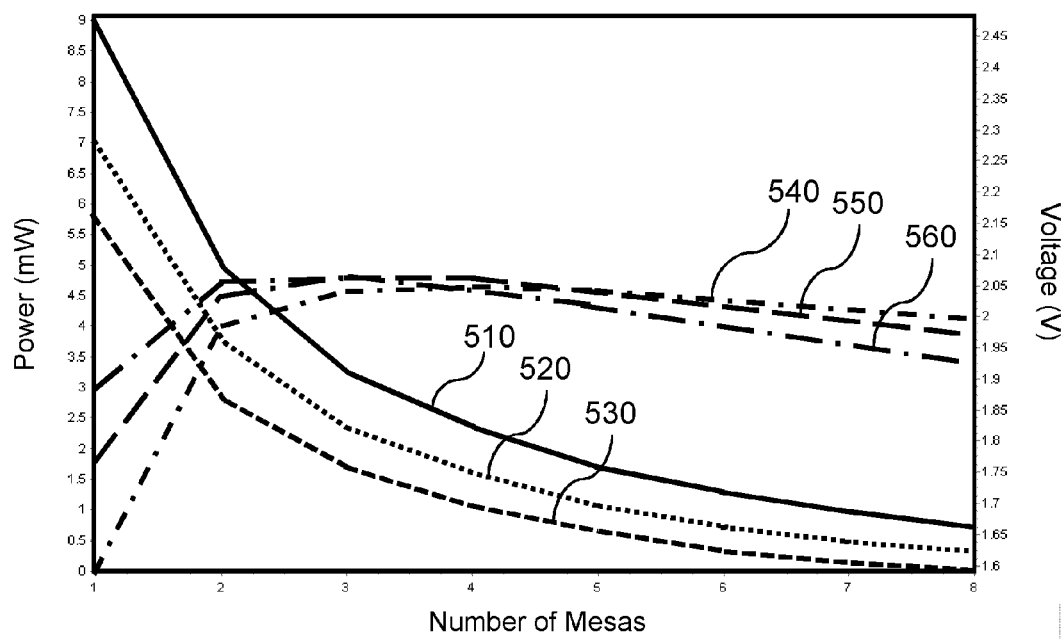

FIG. 5 shows simulated performance data at 60° C. depending on the number of mesas provided on the semiconductor chip 110. The applied electrical current is 12 mA. Line 510 shows the simulated voltage of laser devices depending on the number of mesas provided on the semiconductor chip 110. The production spread of the mesas is nominal−1 Sigma. Line 520 shows the simulated voltage at the nominal value of the active diameter and line 530 the simulated voltage at the production spread of nominal+1 Sigma. Lines 540, 550 and 560 show the respective simulated optical power at a production spread of nominal−1 Sigma, nominal and nominal+1 Sigma depending on the number of mesas provided on the semiconductor chip 110 at 60° C. The spread of the emitted optical power is acceptable when between 2 and 6 mesas are provided on the semiconductor chip. One mesa causes a broad spread and the applied voltage is too high. The power spread is minimal if three mesas are provided and gets unacceptable if more than six mesas are provided. Furthermore, the voltage decreases such that the voltage requirements are not fulfilled. Laser devices with semiconductor chips 110 with 2 to 6 mesas provided on the semiconductor chip 110 within the production spread of nominal+/−1 Sigma thus fulfill the quality requirements within a temperature range of 25° C. to 60° C. and also in the temperature range between −10° C. to 60° C. The latter temperature range is the temperature range of most applications and the spread empirically decreases at lower temperatures at least at moderate temperatures like −10° C.

Figure 6:
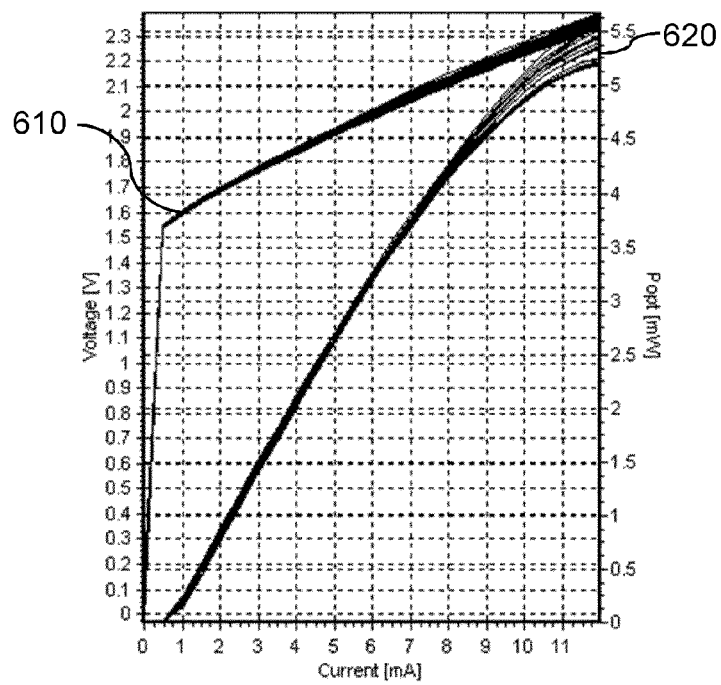
Figure 8:
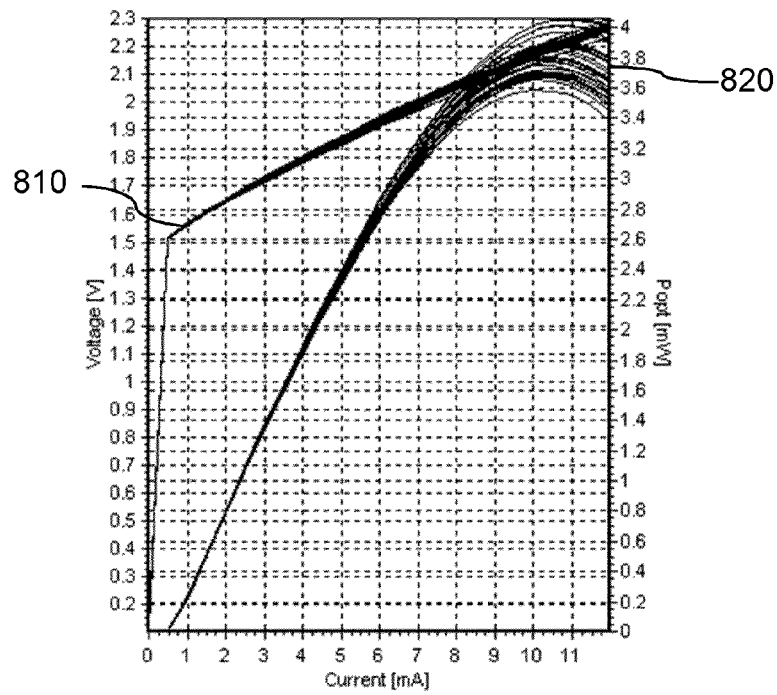

FIGS. 6 and 8 show the optical power and the electrical voltage of measured laser devices with a semiconductor chip comprising one mesa at 25° C. and 60° C. respectively. The applied electrical current was varied between 0 mA and 12 mA. The optical power versus current line 620 of several laser devices measured at 25° C. is depicted in FIG. 6. The emitted optical power depends essentially linearly from the applied electrical current in a range between 2 mA and around 7 mA. Additionally, the spread of the emitted optical power of the individual devices increases above an applied electrical current of around 8 mA. This behavior is even more pronounced at a substrate temperature of 60° C. The emitted optical power depends linearly on the applied electrical current only in a current range between 1 mA and around 6 mA as depicted by line 820. Already at 6 mA the spread of the emitted optical power increases and is much broader in comparison to the spread of 25° C. Furthermore, most of the measured laser devices emit less than 4 mW at 60° C.

Figure 7:
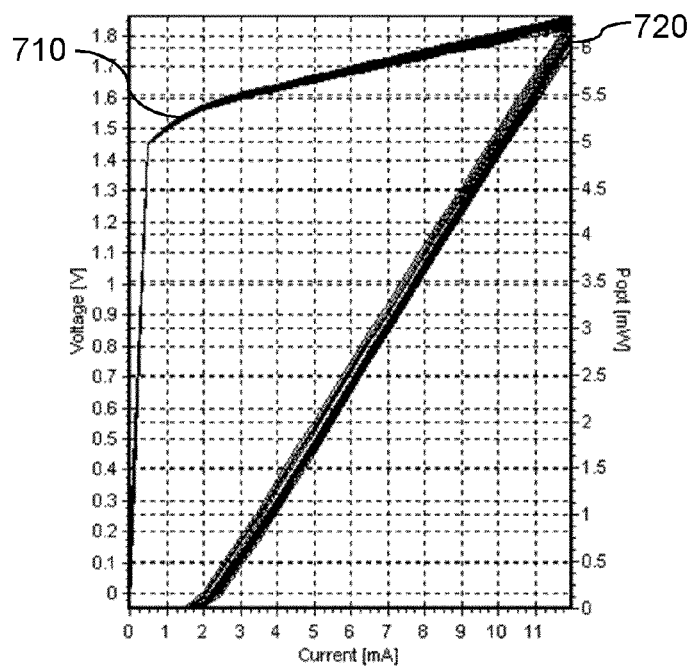
Figure 9:
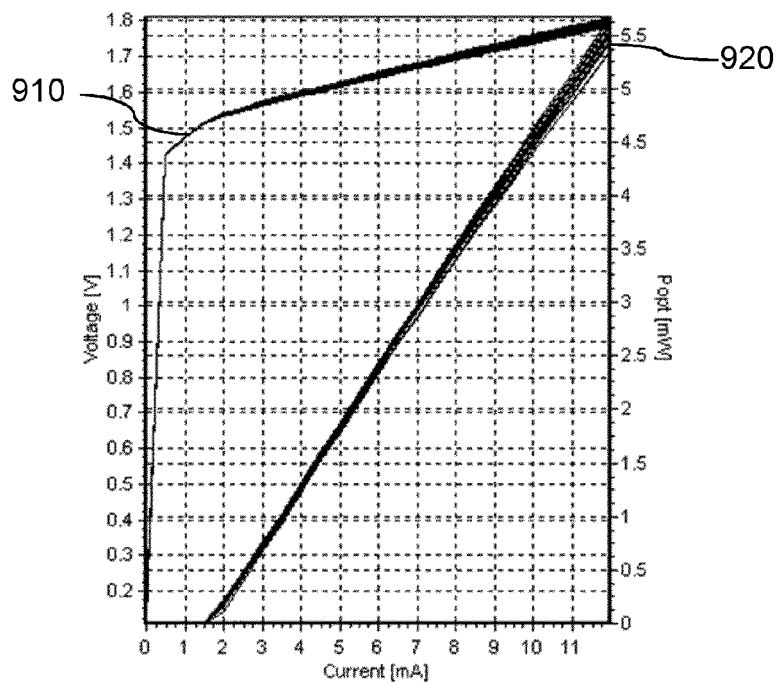

FIGS. 7 and 9 show the optical power and the electrical voltage of measured laser devices with a semiconductor chip comprising three mesas at 25° C. and 60° C. respectively. The applied electrical current was again varied between 0 mA and 12 mA. The optical power versus current line 720 of several laser devices measured at 25° C. is depicted in FIG. 7. The emitted optical power depends essentially linearly from the applied electrical current in a range between 2 mA and 12 mA. Additionally, the spread of the emitted optical power of the individual devices is low across the whole current range and doesn't increases above a threshold current. Furthermore, the behavior of the laser devices with three mesas is essentially the same at a substrate temperature of 60° C. The emitted optical power depends linearly on the applied electrical current in a current range between 2 mA and 12 mA. Only a minimum spread of the emitted optical power can be observed above 10 mA applied electrical current.

The measured data shown in FIGS. 6-9 thus impressively confirm the simulation data shown in FIGS. 4 and 5. The spread of emitted optical power at an applied electrical current of 12 mA is much lower for laser device comprising a semiconductor chip 110 with 3 mesas and reduced active diameter in comparison to a conventional semiconductor chip 110 with 1 mesa and increased active diameter. Most of the measured laser devices with one mesa even miss the specification of emitting at least 4 mW optical power at 12 mA and a substrate temperature of 60° C.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

110 semiconductor chip
120 mesa
130 metallization layer
140 binary code
150 alignment marks
160 bonding area
210 bottom electrode
220 ring electrode
230 bottom DBR
240 top DBR
250 confinement layer
260 active layer
270 substrate
310 wafer
320 reference die
330 test structure
410 voltage versus number of mesas nominal−sigma at 25° C.
420 voltage versus number of mesas nominal at 25° C.
430 voltage versus number of mesas nominal+sigma at 25° C.
440 power versus number of mesas nominal−sigma at 25° C.
450 power versus number of mesas nominal at 25° C.
460 power versus number of mesas nominal+sigma at 25° C.
510 voltage versus number of mesas nominal−sigma at 60° C.
520 voltage versus number of mesas nominal at 60° C.
530 voltage versus number of mesas nominal+sigma at 60° C.
540 power versus number of mesas nominal−sigma at 60° C.
550 power versus number of mesas nominal at 60° C.
560 power versus number of mesas nominal+sigma at 60° C.
610 voltage versus current one mesa at 25° C.
620 power versus current one mesa at 25° C.
710 voltage versus current three mesas at 25° C.
720 power versus current three mesas at 25° C.
810 voltage versus current one mesa at 60° C.
820 power versus current one mesa at 60° C.
910 voltage versus current three mesas at 60° C.
920 power versus current three mesas at 60° C.

The invention claimed is:

1. A laser device, comprising:
   between two and four mesas provided on one semiconductor chip and electrically connected in parallel with each; and
   a driver configured to electrically drive the mesas,
   wherein the driver is configured to provide a defined threshold voltage to the between two to four mesas, and the between two to four mesas are configured so that in response to receiving the defined threshold voltage they emit laser light at the same time as each other, and
   wherein each mesas has an active diameter between 7 μm and 9 μm,
   wherein the semiconductor chip has a side length of less than 150 μm, and
   wherein the laser device is adapted to emit laser light with an optional power, wherein the optical power linearly depends on the provided electrical current when driven at an electrical current between 3 mA and 12 mA.

2. The device according to claim 1, comprising three mesas.

3. The device according to claim 1, wherein the laser device is adapted to emit laser light of an optical power between 4 mW and 10 mW.

4. The device according to claim 3, wherein the laser device is adapted to be driven at a voltage between 1.6 V and 2.2 V at an electrical current of 12 mA when emitting laser light of an optical power between 4 mW and 10 mW.

5. The device according to claim 1, wherein the laser device is adapted to emit laser light of an optical power between 4 mW and 10 mW at a temperature of 60° C. of the semiconductor chip.

6. The device according to claim 5, wherein the laser device is adapted to emit laser light of an optical power at a temperature of 25° C. of the semiconductor chip deviating less than 20% from the laser power emitted at 60° C. of the semiconductor chip when driven at an electrical current of 12 mA.

7. The device according to claim 1, wherein the semiconductor chip comprises a functional layer, the functional layer comprising a coding for identifying the laser device.

8. The device according to claim 7, wherein the functional layer is a metallization layer of the semiconductor chip.

9. The device according to claim 8, wherein the metallization layer comprises a binary coding at at least one edge of the semiconductor chip.

10. The device according to claim 1, wherein the mesas are distributed on the semiconductor chip in a way such that an even heat distribution is enabled across the semiconductor chip.

11. The device of claim 9, wherein the metallization layer includes an electrical contact of the semiconductor chip.

12. A device, comprising,
a substrate defining one semiconductor chip;
a plurality of mesas provided on the substrate in the one semiconductor chip, the plurality being not greater than four; and
a metallization layer disposed on the substrate, the metallization layer including an electrical contact of the semiconductor chip;
wherein the plurality of mesas are electrically connected in parallel with each other and are configured to be provided with a defined threshold voltage at the same time as each other and in response to receiving the defined threshold voltage the plurality of mesas emit laser light at the same time as each other, and
wherein each mesas has an active diameter between 7 μm and 9 μm, and
wherein the metallization layer which includes the electrical contact of the semiconductor chip also includes a coding for identifying the device.

13. The device of claim 12, wherein the plurality of mesas is three mesas.

14. The device of claim 12, wherein the metallization layer comprises a binary coding at at least one edge of the semiconductor chip.

15. The device of claim 12, wherein the device is adapted to emit the laser light with an optical power, wherein the optical power linearly depends on the provided electrical current when driven at an electrical current between 3 mA and 12 mA.

16. A device, comprising:
a substrate defining one semiconductor chip;
a plurality of mesas provided on the substrate in the one semiconductor chip, the plurality being not greater than six; and
a metallization layer disposed on the substrate, the metallization layer including an electrical contact of the semiconductor chip, and further including a number of extensions of different widths disposed along at least one edge of the semiconductor chip and forming a binary coding which uniquely identifies the semiconductor chip,
wherein the plurality of mesas are electrically connected in parallel with each other and are configured to be provided with a defined threshold voltage at the same time as each other and in response to receiving the defined threshold voltage the plurality of mesas emit laser light at the same time as each other, and
wherein each mesa has an active diameter between 5 μm and 9 μm.

* * * * *